US006882088B2

(12) United States Patent
Wong

(10) Patent No.: US 6,882,088 B2
(45) Date of Patent: Apr. 19, 2005

(54) BENDING-MODE LATCHING RELAY

(75) Inventor: Marvin Glenn Wong, Woodland Park, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 172 days.

(21) Appl. No.: 10/413,068

(22) Filed: Apr. 14, 2003

(65) Prior Publication Data

US 2004/0201315 A1 Oct. 14, 2004

(51) Int. Cl.$^7$ ........................ H01L 41/08; H01H 29/00; H01H 57/00

(52) U.S. Cl. ........................ 310/330; 310/348; 200/182; 200/214; 200/215; 335/47; 335/49; 335/58

(58) Field of Search ................................ 310/328, 330, 310/348; 200/182, 214, 215; 335/47, 49, 58

(56) References Cited

U.S. PATENT DOCUMENTS

| | | | | | |
|---|---|---|---|---|---|
| 2,312,672 | A | | 3/1943 | Pollard, Jr. | 335/58 |
| 2,564,081 | A | | 8/1951 | Schilling | 335/56 |
| 3,430,020 | A | * | 2/1969 | Tomkewitsch et al. | 200/181 |
| 3,529,268 | A | | 9/1970 | Rauterberg | 335/56 |
| 3,600,537 | A | | 8/1971 | Twyford | 200/407 |
| 3,639,165 | A | | 2/1972 | Rairden, III | 428/433 |
| 3,657,647 | A | | 4/1972 | Beusman et al. | 324/94 |
| 4,103,135 | A | | 7/1978 | Gomez et al. | 200/185 |
| 4,200,779 | A | | 4/1980 | Zakurdaev et al. | 200/187 |
| 4,238,748 | A | | 12/1980 | Goullin et al. | 335/56 |
| 4,245,886 | A | | 1/1981 | Kolodzey et al. | 385/19 |
| 4,336,570 | A | | 6/1982 | Brower et al. | 362/4 |
| 4,419,650 | A | | 12/1983 | John | 337/119 |
| 4,434,337 | A | | 2/1984 | Becker | 200/220 |
| 4,475,033 | A | | 10/1984 | Willemsen et al. | 250/201.1 |
| 4,505,539 | A | | 3/1985 | Auracher et al. | 385/19 |

(Continued)

FOREIGN PATENT DOCUMENTS

| | | | |
|---|---|---|---|
| EP | 0593836 | A1 | 10/1992 |
| FR | 2418539 | A | 9/1979 |
| FR | 2458138 | A1 | 10/1980 |
| FR | 2667396 | | 9/1990 |
| JP | SHO 36-18575 | | 10/1961 |
| JP | SHO 47-21645 | | 10/1972 |
| JP | 01-294317 | | 5/1988 |
| JP | 08-125487 | A | 5/1996 |
| JP | 63-276838 | | 5/1997 |
| JP | 9161640 | A | 6/1997 |
| WO | WO 99/46624 | A1 | 9/1999 |

OTHER PUBLICATIONS

Jonathan Simon, "A Liquid–Filled Microrelay with a Moving Mercury Microdrop" (Sep. 1997) Journal of Microelectromechanical Systems, vol. 6, No. 3, pp208–216.

(Continued)

*Primary Examiner*—Thomas M. Dougherty

(57) ABSTRACT

An electrical relay that uses a conducting liquid in the switching mechanism. In the relay, a pair of moveable electrical contacts is attached to the free end of a piezoelectric actuator and positioned between pair of fixed electrical contacts. The contacts each support a droplet of a conducting liquid, such as a liquid metal. The piezoelectric actuator is energized to deform in a bending mode and move the pair of moveable contacts, closing the gap between one of the fixed contacts and one of the moveable contacts, thereby causing conducting liquid droplets to coalesce and form an electrical circuit. At the same time, the gap between the other fixed contact and the other moveable contact is increased, thereby causing conducting liquid droplets to separate and break an electrical circuit. The piezoelectric actuator is then de-energized and the moveable electrical contacts return to their starting positions. The volume of liquid metal is chosen so that liquid metal droplets remain coalesced or separated because of surface tension in the liquid. The relay is amenable to manufacture by micro-machining techniques.

13 Claims, 2 Drawing Sheets

U.S. PATENT DOCUMENTS

| | | | | |
|---|---|---|---|---|
| 4,582,391 | A | 4/1986 | Legrand | 385/17 |
| 4,628,161 | A | 12/1986 | Thackrey | 200/61.47 |
| 4,652,710 | A | 3/1987 | Karnowsky et al. | 200/235 |
| 4,657,339 | A | 4/1987 | Fick | 385/22 |
| 4,742,263 | A | 5/1988 | Harnden, Jr. et al. | 310/331 |
| 4,786,130 | A | 11/1988 | Georgiou et al. | 385/48 |
| 4,797,519 | A | 1/1989 | Elenbaas | 200/226 |
| 4,804,932 | A | 2/1989 | Akanuma et al. | 335/38 |
| 4,988,157 | A | 1/1991 | Jackel et al. | 385/17 |
| 5,278,012 | A | 1/1994 | Yamanaka et al. | 430/32 |
| 5,415,026 | A | 5/1995 | Ford | 73/651 |
| 5,502,781 | A | 3/1996 | Li et al. | 385/4 |
| 5,644,676 | A | 7/1997 | Blomberg et al. | 370/416 |
| 5,675,310 | A | 10/1997 | Wojnarowski et al. | 338/309 |
| 5,677,823 | A | 10/1997 | Smith | 361/234 |
| 5,751,074 | A | 5/1998 | Prior et al. | 307/118 |
| 5,751,552 | A | 5/1998 | Scanlan et al. | 361/709 |
| 5,828,799 | A | 10/1998 | Donald | 385/16 |
| 5,841,686 | A | 11/1998 | Chu et al. | 365/51 |
| 5,849,623 | A | 12/1998 | Wojnarowski et al. | 438/382 |
| 5,874,770 | A | 2/1999 | Saia et al. | 257/536 |
| 5,875,531 | A | 3/1999 | Nellissen et al. | 29/25.35 |
| 5,886,407 | A | 3/1999 | Polese et al. | 257/706 |
| 5,889,325 | A | 3/1999 | Uchida et al. | 257/724 |
| 5,912,606 | A | 6/1999 | Nathanson et al. | 335/47 |
| 5,915,050 | A | 6/1999 | Russell et al. | 385/7 |
| 5,972,737 | A | 10/1999 | Polese et al. | 438/122 |
| 5,994,750 | A | 11/1999 | Yagi | 257/415 |
| 6,021,048 | A | 2/2000 | Smith | 361/736 |
| 6,180,873 | B1 | 1/2001 | Bitko | 174/9 F |
| 6,201,682 | B1 | 3/2001 | Mooij et al. | 361/306.1 |
| 6,207,234 | B1 | 3/2001 | Jiang | 427/333 |
| 6,212,308 | B1 | 4/2001 | Donald | 385/16 |
| 6,225,133 | B1 | 5/2001 | Yamamichi et al. | 438/3 |
| 6,278,541 | B1 | 8/2001 | Baker | 359/291 |
| 6,304,450 | B1 | 10/2001 | Dibene, II et al. | 361/704 |
| 6,320,994 | B1 | 11/2001 | Donald et al. | 385/16 |
| 6,323,447 | B1 | 11/2001 | Kondoh et al. | |
| 6,351,579 | B1 | 2/2002 | Early et al. | 385/18 |
| 6,356,679 | B1 | 3/2002 | Kapany | 385/18 |
| 6,373,356 | B1 | 4/2002 | Gutierrez et al. | |
| 6,396,012 | B1 | 5/2002 | Bloomfield | 200/233 |
| 6,396,371 | B1 | 5/2002 | Streeter et al. | 335/78 |
| 6,408,112 | B1 | 6/2002 | Bartels | 385/16 |
| 6,446,317 | B1 | 9/2002 | Figueroa et al. | 29/25.42 |
| 6,453,086 | B1 | 9/2002 | Tarazona | 385/20 |
| 6,470,106 | B1 | 10/2002 | McClelland et al. | 385/16 |
| 6,487,333 | B1 | 11/2002 | Fouquet et al. | 385/18 |
| 6,501,354 | B1 | 12/2002 | Gutierrez et al. | 335/47 |
| 6,504,118 | B1 * | 1/2003 | Hyman et al. | 200/181 |
| 6,512,322 | B1 | 1/2003 | Fong et al. | |
| 6,515,404 | B1 | 2/2003 | Wong | |
| 6,516,504 | B1 | 2/2003 | Schaper | 29/25.42 |
| 6,559,420 | B1 | 5/2003 | Zarev | 219/209 |
| 6,633,213 | B1 | 10/2003 | Dove | 335/78 |
| 2002/0037128 | A1 | 3/2002 | Burger et al. | 385/16 |
| 2002/0146197 | A1 | 10/2002 | Yong | 385/17 |
| 2002/0150323 | A1 | 10/2002 | Nishida et al. | 385/16 |
| 2002/0168133 | A1 | 11/2002 | Saito | 385/16 |
| 2003/0035611 | A1 | 2/2003 | Shi | 385/16 |
| 2004/0200702 | A1 * | 10/2004 | Fong et al. | 200/182 |
| 2004/0201311 | A1 * | 10/2004 | Wong | 310/328 |
| 2004/0201318 | A1 * | 10/2004 | Wong | 310/328 |
| 2004/0201319 | A1 * | 10/2004 | Wong et al. | 310/328 |
| 2004/0201320 | A1 * | 10/2004 | Carson | 310/328 |
| 2004/0201321 | A1 * | 10/2004 | Wong | 310/328 |

OTHER PUBLICATIONS

Marvin Glenn Wong, "A Piezoelectrically Actuated Liquid Metal Switch", May 1, 2002, Patent Application 10/137,691, 12 pages of specification, 5 pages of claims, 1 page of abstract, and 10 sheets of drawings (Figs. 1–10).

Bhedwar, Homi C. et al. "Ceramic Multilayer Package Fabrication," Electronic Materials Handbook, Nov. 1989, pp. 460–469, vol. 1 Packaging, Section 4: Packages.

"Integral Power Resistors for Aluminum Substrate," IBM Technical Disclosure Bulletin, Jun. 1984, US, Jun. 1, 1984, p. 827, vol. 27, No. 1B, TDB–ACC–No. NB8406827, Cross Reference: 0018–8689–27–1B–827.

Kim, Joonwon et al. "A Micromechanical Switch with Electrostatically Driven Liquid–Metal Droplet," Sensors and Actuators, A: Physical. v 9798, Apr. 1, 2002, 4 pages.

* cited by examiner

BENDING-MODE LATCHING RELAY

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application, titled "Piezoelectrically Actuated Liquid Metal Switch", filed May 2, 2002 and identified by Ser. No. 10/137,691;

Application Ser. No. 10/412,912, "High Frequency Bending Mode Latching Relay", and having the same filing date as the present application;

Application, titled "Piezoelectrically Actuated Liquid Metal Switch", filed May 2, 2002 and identified by Ser. No. 10/142,076;

Application Ser. No. 10/412,991, "High-frequency, Liquid Metal, Latching Relay with Face Contact", and having the same filing date as the present application;

Application Ser. No. 10/413,195, "Liquid Metal, Latching Relay with Face Contact", and having the same filing date as the present application;

Application Ser. No. 10/412,824, "Insertion Type Liquid Metal Latching Relay", and having the same filing date as the present application;

Application Ser. No. 10/413,278, "High-frequency, Liquid Metal, Latching Relay Array", and having the same filing date as the present application;

Application Ser. No. 10/413,278, "Insertion Type Liquid Metal Latching Relay Array", and having the same filing date as the present application;

Application Ser. No. 10/413,267, "Liquid Metal Optical Relay", and having the same filing date as the present application;

Application, titled "A Longitudinal Piezoelectric Optical Latching Relay", filed Oct. 31, 2001 and identified by Ser. No. 09/999,590;

Application Ser. No. 10/413,314, "Shear Mode Liquid Metal Switch", and having the same filing date as the present application;

Application Ser. No. 10/413,298, "Bending Mode Liquid Metal Switch", and having the same filing date as the present application;

Application Ser. No. 10/413,251, titled "A Longitudinal Mode Optical Latching Relay", and having the same filing date as the present application;

Application Ser. No. 10/413,098, "Method and Structure for a Pusher-Mode Piezoelectrically Actuated Liquid Metal Switch", and having the same filing date as the present application;

Application Ser. No. 10/412,895, "Method and Structure for a Pusher-Mode Piezoelectrically Actuated Liquid Metal Optical Switch", and having the same filing date as the present application;

Application, titled "Switch and Production Thereof", filed Dec. 12, 2002 and identified by Ser. No. 10/317,597;

Application Ser. No. 10/413,237, "High Frequency Latching Relay with Bending Switch Bar", and having the same filing date as the present application;

Application Ser. No. 10/413,099, "Latching Relay with Switch Bar", and having the same filing date as the present application;

Application Ser. No. 10/413,100, "High Frequency Push-mode Latching Relay", and having the same filing date as the present application;

Application Ser. No. 10/413,067, "Push-mode Latching Relay", and having the same filing date as the present application;

Application Ser. No. 10/412,857, "Closed Loop Piezoelectric Pump", and having the same filing date as the present application;

Application, titled "Solid Slug Longitudinal Piezoelectric Latching Relay", filed May 2, 2002 and identified by Ser. No. 10/137,692;

Application Ser. No. 10/412,869, "Method and Structure for a Slug Pusher-Mode Piezoelectrically Actuated Liquid Metal Switch", and having the same filing date as the present application;

Application Ser. No. 10/412,916, "Method and Structure for a Slug Assisted Longitudinal Piezoelectrically Actuated Liquid Metal Optical Switch", and having the same filing date as the present application;

Application Ser. No. 10/413,070, "Method and Structure for a Slug Assisted Pusher-Mode Piezoelectrically Actuated Liquid Metal Optical Switch", and having the same filing date as the present application;, Application Ser. No. 10/413,094, "Polymeric Liquid Metal Switch", and having the same filing date as the present application;

Application Ser. No. 10/412,859, "Polymeric Liquid Metal Optical Switch", and having the same filing date as the present application;

Application Ser. No. 10/412,868, "Longitudinal Electromagnetic Latching Optical Relay", and having the same filing date as the present application;

Application Ser. No. 10/413,329, "Longitudinal Electromagnetic Latching Relay", and having the same filing date as the present application;

Application Ser. No. 10/412,894, "Damped Longitudinal Mode Optical Latching Relay", and having the same filing date as the present application;

Application Ser. No. 10/412,914, "Damped Longitudinal Mode Latching Relay", and having the same filing date as the present application;

Application, titled "Switch and Method for Producing the Same", filed December 12, 2002 and identified by Ser. No. 10/317,963;

Application, titled "Piezoelectric Optical Relay", filed Mar. 28, 2002 and identified by Ser. No. 10/109,309;

Application, titled "Electrically Isolated Liquid Metal Micro-Switches for Integrally Shielded Microcircuits", filed Oct. 8, 2002 and identified by Ser. No. 10/266,872;

Application, titled "Piezoelectric Optical Demultiplexing Switch", filed Apr. 10, 2002 and identified by Ser. No. 10/119,503;

Application, titled "Volume Adjustment Apparatus and Method for Use", filed Dec. 12, 2002 and identified by Ser. No. 10/317,293;

Application Ser. No. 10/413,002, "Method and Apparatus for Maintaining a Liquid Metal Switch in a Ready-to-Switch Condition", and having the same filing date as the present application;

Application Ser. No. 10/412,858, titled "A Longitudinal Mode Solid Slug Optical Latching Relay", and having the same filing date as the present application;

Application Ser. No. 10/413,270, titled "Reflecting Wedge Optical Wavelength Multiplexer/Demultiplexer", and having the same filing date as the present application;

Application Ser. No. 10/413,088, "Method and Structure for a Solid Slug Caterpillar Piezoelectric Relay", and having the same filing date as the present application;

Application Ser. No. 10/413,196, titled "Method and Structure for a Solid Slug Caterpillar Piezoelectric Optical Relay", and having the same filing date as the present application;

Application Ser. No. 10/413,187, "Inserting-finger Liquid Metal Relay", and having the same filing date as the present application;

Application Ser. No. 10/413,058, "Wetting Finger Liquid Metal Latching Relay", and having the same filing date as the present application;

Application Ser. No. 10/412,874, "Pressure Actuated Optical Latching Relay", and having the same filing date as the present application;

Application Ser. No. 10/413,162, "Pressure Actuated Solid Slug Optical Latching Relay", and having the same filing date as the present application; and Application Ser. No. 10/412,910, "Method and Structure for a Slug Caterpillar Piezoelectric Reflective Optical Relay", and having the same filing date as the present application.

FIELD OF THE INVENTION

The invention relates to the field of micro-electromechanical systems (MEMS) for electrical switching, and in particular to a piezoelectrically actuated latching relay with liquid metal contacts.

BACKGROUND OF THE INVENTION

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Conventional piezoelectric relays either do not latch or use residual charges in the piezoelectric material to latch or else activate a switch that contacts a latching mechanism.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY OF THE INVENTION

An electrical relay is disclosed that uses a conducting liquid in the switching mechanism. In the relay, a pair of moveable electrical contacts is attached to the free end of a piezoelectric actuator and positioned between a pair of fixed electrical contacts. The contacts each support a droplet of a conducting liquid, such as a liquid metal. The piezoelectric actuator is energized to deform in bending mode and move the pair of moveable contacts, closing the gap between one of the fixed contacts and one of the moveable contacts, thereby causing conducting liquid droplets to coalesce and form an electrical circuit. At the same time, the gap between the other fixed contact and the other moveable contact is increased, causing conducting liquid droplets to separate and break an electrical circuit.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
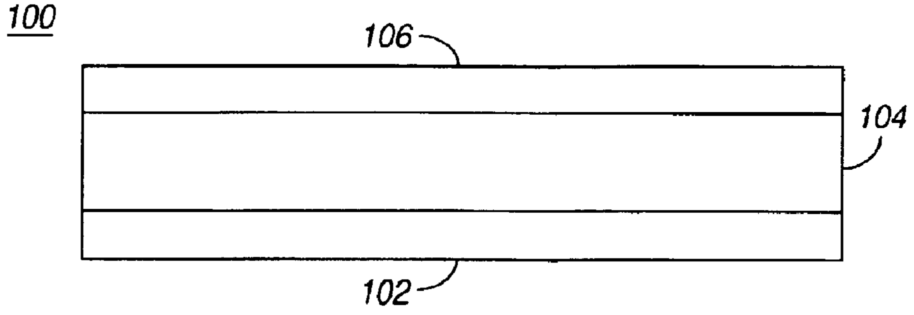
FIG. 1 is a side view of a latching relay of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The electrical relay of the present invention uses a conducting fluid, such as liquid metal, to bridge the gap between two electrical contacts and thereby complete an electrical circuit between the contacts. Two moveable electrical contacts are attached to the free end of a piezoelectric actuator and positioned between a pair of fixed electrical contacts. Magnetorestrictive actuators, such as Terfenol-D, that deform in the presence of a magnetic field may be used as an alternative to piezoelectric actuators. In the sequel, piezoelectric actuators and magnetorestrictive actuators will be collectively referred to as "piezoelectric actuators". Each of the facing surfaces of the fixed electrical contacts supports a droplet of a conducting liquid. In the preferred embodiment, the conducting liquid is a liquid metal, such as mercury, with high conductivity, low volatility and high surface tension. When energized, the piezoelectric actuator bends so that the free end moves between the fixed contacts and the first moveable contact moves towards a first fixed contact, causing the two conducting liquid droplets to coalesce and complete an electrical circuit between the contacts. At the same time the second moveable contact moves away from the second fixed contact. After the switch-state has changed the piezoelectric actuator is de-energized and the moveable contacts return to their starting positions. The conducting liquid droplets remain coalesced because the volume of conducting liquid is chosen so that surface tension holds the droplets together. The electrical circuit is broken again by energizing the piezoelectric actuator to move the first moveable electrical contact away from the first fixed electrical contact to break the surface tension bond between the conducting liquid droplets. The droplets remain separated when the piezoelectric actuator is de-energized provided there is insufficient liquid to bridge the gap between the contacts. The relay is amenable to manufacture by micro-machining techniques.

FIG. 1 is a side view of an embodiment of a latching relay of the present invention. Referring to FIG. 1, the relay 100 comprises three layers: a circuit substrate 102, a switching layer 104 and a cap layer 106. These three layers form the relay housing. The circuit substrate 102 supports electrical connections to the elements in the switching layer and provides a lower cap to the switching layer. The circuit substrate 102 may be made of a ceramic or silicon, for example, and is amenable to manufacture by micro-machining techniques, such as those used in the manufacture of micro-electronic devices. The switching layer 104 may be made of ceramic or glass, for example, or may be made of metal coated with an insulating layer (such as a ceramic). The cap layer 106 covers the top of the switching layer 108, and seals the switching cavity 108. The cap layer 106 may be made of ceramic, glass, metal or polymer, for example, or combinations of these materials. Glass, ceramic or metal is used in the preferred embodiment to provide a hermetic seal.

Figure 2:
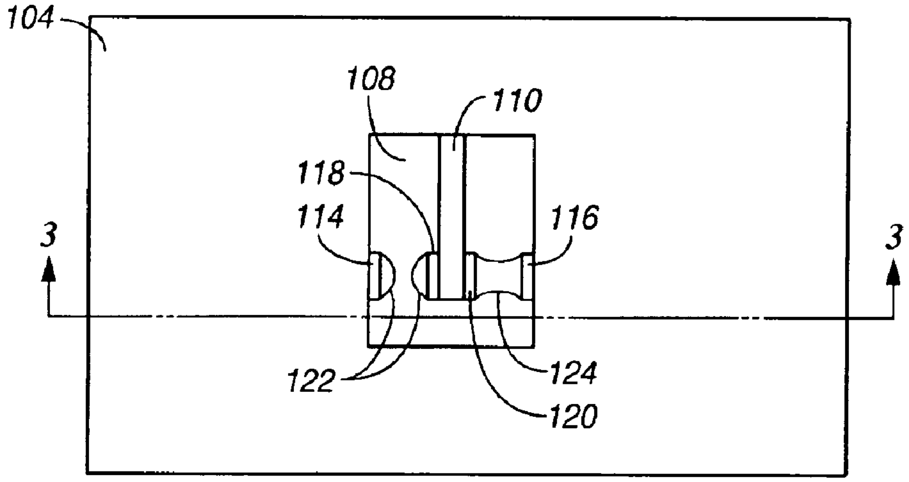
FIG. 2 is a top view of a latching relay of the present invention with the cap layer removed.

FIG. 2 is a top view of the relay with the cap layer removed. Referring to FIG. 2, the switching layer 104 incorporates a switching cavity 108. The switching cavity 108 is sealed below by the circuit substrate 102 and sealed above by the cap layer 106. The cavity may be filled with an inert gas. A piezoelectric element 110 is attached to the switching layer. The piezoelectric actuator 110 is polarized to deform in a bending mode so that the free end moves laterally in the figure. The actuator may comprise a stack of piezoelectric elements. Fixed electrical contacts 114 and 116 are attached to the switching layer. Moveable electrical contacts 118 and 120 are attached to the free end of the actuator 110. The moveable electrical contacts may be electrically connected to each other. The exposed faces of the contacts are wettable by a conducting liquid, such as a liquid metal. The surfaces between the contacts are non-wettable to prevent liquid migration. The surfaces of the contacts support droplets of conducting liquid. In FIG. 2, the liquid between contacts 114 and 118 is separated into two droplets 122, one on each of the contacts 114 and 118. The liquid between contacts 120 and 116 is coalesced into a single volume 124. Thus, there is an electrical connection between the contacts 120 and 116, but no connection between the contacts 114 and 118.

When the free end of the actuator moves the first moveable contact 118 away from the first fixed contact 114, the second moveable contact 120 is moved towards the second fixed contact 116. Conversely, when the free end of the actuator 110 moves the first moveable contact 118 towards the first fixed contact 114, the second moveable contact 120 is moved away from the second fixed contact 116. When the gap between the contacts 116 and 120 is great enough, the conducting liquid 124 is insufficient to bridge the gap between the contacts and the conducting liquid connection is broken. When the gap between the contacts 118 and 114 is small enough, the liquid droplets 122 on the two contacts coalesce with each other and form an electrical connection. The droplets of conducting liquid are held in place by the surface tension of the fluid. Due to the small size of the droplets, the surface tension dominates any body forces on the droplets.

Figure 3:
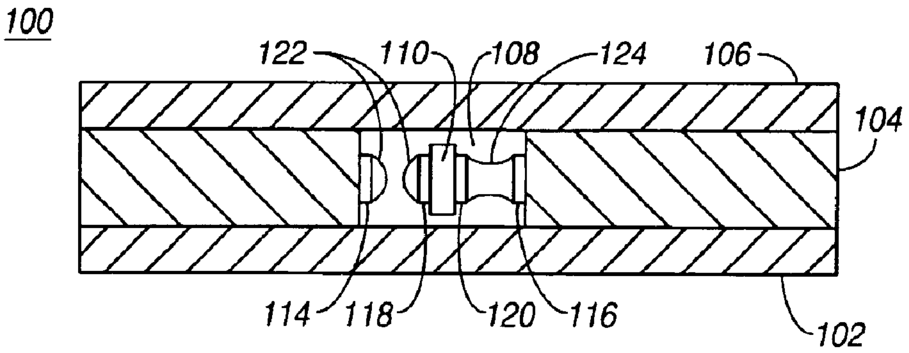
FIG. 3 is a sectional view of a latching relay of the present invention.

FIG. 3 is a sectional view through section 3—3 of the latching relay shown in FIG. 2. The view shows the three layers: the circuit substrate 102, the switching layer 104 and the cap layer 106. The free end of the actuator 110 is moveable within the switching channel 108. Electrical connection traces (not shown) to supply control signals to the actuator 110 may be deposited on the upper surface of the circuit substrate 102 or pass through vias in the circuit substrate. Similarly, electrical connection traces to the contact pads are deposited on the upper surface of the circuit substrate 102. External connections may be made through solder balls on the underside of the circuit substrate or via short ribbon wirebonds to pads at the ends of the circuit traces.

The use of mercury or other liquid metal with high surface tension to form a flexible, non-contacting electrical connection results in a relay with high current capacity that avoids pitting and oxide buildup caused by local heating.

Figure 4:
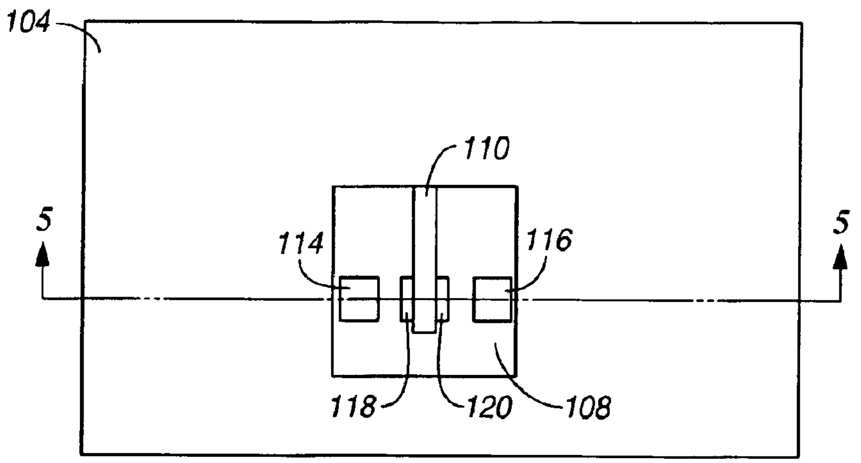
FIG. 4 is a top view of a further embodiment of a latching relay of the present invention with the cap layer removed.

A further embodiment of the present invention is shown in FIG. 4. In FIG. 4 the cap layer and the conducting liquid have been removed. Referring to FIG. 4, the fixed contacts 114 and 116 are attached to the upper surface of the circuit substrate, rather than to the vertical sides of the cavity 108. The contacts 114 and 118 are thus positioned at right angles to each other, rather than face to face. The contacts 120 and 116 are similarly at right angles to each other. One advantage of this embodiment is that horizontal contacts are easier to form in some micro-machining processes. The operation of the relay is the same as the embodiment described above with reference to FIG. 2 and FIG. 3.

Figure 5:
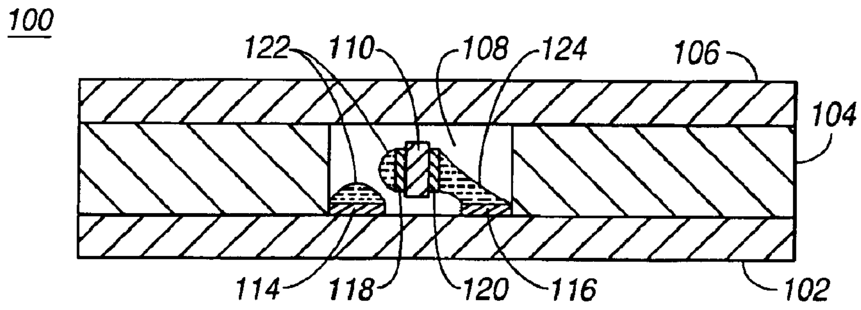
FIG. 5 is a sectional view of the further embodiment of a latching relay of the present invention.

FIG. 5 is a sectional view through the section 5—5 shown in FIG. 4. The conducting liquid droplet 124 fills the gap between contacts 120 and 116 and completes the electrical circuit between the contacts. A control signal applied to the piezoelectric actuator 110 causes it to deform in a bending mode and move the free end towards the fixed contact 114. This motion increases the gap between the contacts 120 and 116 and breaks the surface tension bond in the liquid 124. The liquid separates into two droplets, one on each contact, and the electrical circuit is broken. At the same time, the contacts 114 and 118 are moved closer together and the droplets 122 coalesce to complete the circuit between contacts 114 and 118. The liquid volume is chosen so that when the actuator is de-energized and returns to its undeflected position, the coalesced droplets remain coalesced and the separated droplets remain separated. In this way the relay is latched into the new switch-state.

The relay may be used to switch a signal between two terminals.

Figure 6:
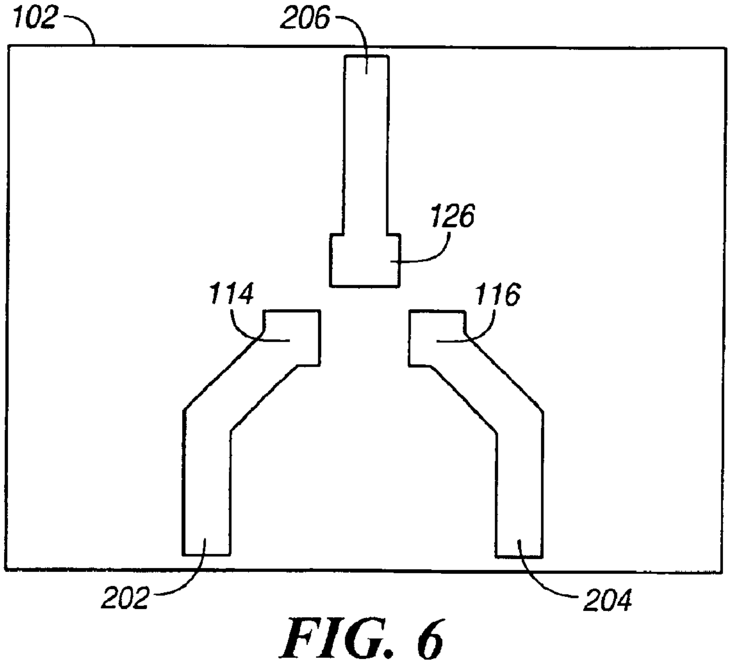
FIG. 6 is a top view of a circuit substrate in accordance with certain aspects of the present invention.

FIG. 6 is a top view of a circuit substrate 102. In this embodiment, electrical traces 202, 204 and 206 are deposited or formed on the top surface of the substrate to permit electrical connections to the contacts 114, 116 and 126 respectively.

While the invention has been described in conjunction with specific embodiments, it is evident that many alternatives, modifications, permutations and variations will become apparent to those of ordinary skill in the art in light of the foregoing description. Accordingly, the present invention is intended to embrace all such alternatives, modifications and variations as fall within the scope of the appended claims.

What is claimed is:

1. An electrical relay comprising:

a relay housing containing a switching cavity;

first and second fixed electrical contacts attached to the relay housing in the switching cavity each having a wettable surface;

first and second moveable electrical contacts positioned between the first and second fixed electrical contacts, the first and second moveable electrical contacts, each having a wettable surface;

a first conducting liquid volume in wetted contact with the first moveable electrical contact and the first fixed electrical contact;

a second conducting liquid volume in wetted contact with the second moveable electrical contact and the second fixed electrical contact; and a piezoelectric actuator in a rest position having fixed end attached to the relay housing and a free end supporting the first and second moveable electrical contacts, the piezoelectric actuator being operable to move the free end in a first direction, to reduce the distance between the first moveable electrical contact and the first fixed electrical contact and increase the distance between the second moveable electrical contact and the second fixed electrical contact, and in a second direction to increase the distance between the first moveable electrical contact and the first fixed electrical contact and decrease the distance between the second moveable electrical contact and the second fixed electrical contact, wherein:

motion of the free end of the piezoelectric actuator in the first direction causes the first conducting liquid volume to form a connection between the first moveable electrical contact and the first fixed electrical contact and breaks a connection formed by the second conducting liquid volume between the second moveable electrical contact and the second fixed electrical contact; and motion of the free end of the piezoelectric actuator in the second direction breaks the connection formed by the first conducting liquid volume between the first moveable electrical contact and the first fixed electrical contact and causes the second conducting liquid to form a connection between the second moveable electrical contact and the second fixed electrical contact.

2. An electrical relay in accordance with claim 1, wherein the first and second conducting liquid volumes are liquid metal droplets.

3. An electrical relay in accordance with claim 1, wherein the first and second conducting liquid volumes are such that connected volumes remain connected when the actuator is returned to its rest position, and separated volumes remain separated when the actuator is returned to its rest position.

4. An electrical relay in accordance with claim 1, further comprising:

a circuit substrate supporting electrical connections to the piezoelectric actuator, the first and second moveable electrical contacts and the first and second fixed electrical contacts;

a cap layer; and a switching layer positioned between the circuit substrate and the cap layer and having the switching cavity formed therein.

5. An electrical relay in accordance with claim 4, wherein at least one of the electrical connections to the first and second fixed electrical contacts and the first and second moveable electrical contacts passes through the circuit substrate and terminates in a solder ball.

6. An electrical relay in accordance with claim 4, wherein at least one of the electrical connections to the first and second fixed electrical contacts and the first and second moveable electrical contacts is a trace deposited on the surface of the circuit substrate.

7. An electrical relay in accordance with claim 4, wherein at least one of the electrical connections to the first and second fixed electrical contacts and the first and second moveable electrical contacts terminates at an edge of the switching layer.

8. An electrical relay in accordance with claim 4, manufactured by a method of micro-machining.

9. An electrical relay in accordance with claim 1, wherein the first and second fixed electrical contacts are electrically coupled to each other.

10. An electrical relay in accordance with claim 1, wherein the first and second moveable electrical contacts are electrically coupled to each other.

11. A method for switching between a first electrical circuit, between a first movable contact and a first fixed contact, and a second electrical circuit, between a second moveable contact and a second fixed contact, in a relay, the relay including a piezoelectric actuator having a fixed end attached to the relay and a free end supporting the first and second switching contacts between the first and second fixed contacts, the method comprising:

if the first electrical circuit is to be selected:

energizing the piezoelectric actuator to deform in a bending mode and move the free end of the piezoelectric actuator in a first direction, thereby moving the first moveable contact towards the first fixed contact so that a first conducting liquid, supported by at least one of the first moveable contact and the first fixed contact, wets between the first moveable contact and the first fixed contact and completes the first electrical circuit; and if the second electrical circuit is to be selected:

energizing the piezoelectric actuator to deform in a bending mode and move the free end of the piezoelectric actuator in a second direction, thereby moving the second moveable contact towards the second fixed contact so that a second conducting liquid, supported by at least one of the second moveable contact and the second fixed contact, wets between the second moveable contact and the second fixed contact and completes the second electrical circuit.

12. A method in accordance with claim 11, wherein:

motion of the free end of the piezoelectric actuator in the first direction moves the second moveable contact away from the second fixed contact, so that the second conducting liquid cannot wet between the second moveable contact and the second fixed contact, thereby breaking the second electrical circuit; and motion of the free end of the piezoelectric actuator in the second direction moves the first moveable contact away from the first fixed contact, so that the first conducting liquid cannot wet between the first moveable contact and the first fixed contact, thereby breaking the first electrical circuit.

13. A method in accordance with claim 11, further comprising:

if the first electrical circuit is to be selected:

de-energizing the piezoelectric actuator after the first conducting liquid wets between the first moveable contact and the first fixed contact; and if the second electrical circuit is to be selected:

de-energizing the piezoelectric actuator after the second conducting liquid wets between the second moveable contact and the second fixed contact.

* * * * *